(12) United States Patent
Timko

(10) Patent No.: US 6,252,534 B1
(45) Date of Patent: Jun. 26, 2001

(54) RESISTOR STRING DAC WITH CURRENT MODE INTERPOLATION

(75) Inventor: Michael P. Timko, Andover, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/231,466

(22) Filed: Jan. 14, 1999

(51) Int. Cl.[7] .............................. H03M 1/78; H03M 1/66
(52) U.S. Cl. ................................ 341/154; 341/145
(58) Field of Search ................................ 341/144, 154, 341/118, 159, 145, 156; 708/8

(56) References Cited

U.S. PATENT DOCUMENTS

| | | | |
|---|---|---|---|
| 4,885,581 | * 12/1989 | Sugawara et al. | 341/145 |
| 4,918,448 | * 4/1990 | Hauviller et al. | 341/145 |
| 5,627,537 | 5/1997 | Quinlan et al. | 341/144 |
| 5,703,588 | * 12/1997 | Rivoir et al. | 341/159 |
| 5,808,576 | 9/1998 | Chloupek et al. | 341/144 |
| 5,940,020 | * 8/1999 | Ho | 341/145 |

OTHER PUBLICATIONS

Nicholas van Bavel, "A 325 MHz 3.3V 10–Bit CMOS D/A Converter . . . ," IEEE, 245–248, May 1998.*
Nicholas van Bavel, "A 325 MHz 3.3V 10–Bit CMOS D/A Converter . . . ," IEEE, 245–248, May 1998.*

* cited by examiner

Primary Examiner—Patrick Wamsley
(74) Attorney, Agent, or Firm—Wolf, Greenfield & Sacks, P.C.

(57) ABSTRACT

An N-bit DAC converts an N-bit digital word to an analog voltage. An n-bit modified string DAC, including no more than $2^n$ taps, receives as an input, n MSBs of the N-bit digital word and provides the analog voltage as an output. An m-bit interpolating DAC, coupled to the n-bit modified string DAC, receives as an input, m LSBs of the N-bit digital word, and provides an analog output to the string DAC. Preferably, n=m=N/2. In an embodiment, the interpolating DAC includes first and second current DACs, each of which provides current to or from the n-bit modified string DAC, depending on the level of the LSBs.

12 Claims, 7 Drawing Sheets

US 6,252,534 B1

RESISTOR STRING DAC WITH CURRENT MODE INTERPOLATION

FIELD OF THE INVENTION

The present invention is related generally to the field of digital-to-analog converters (DACs) and, more particularly, to a string DAC having current mode interpolation enabling a reduction in number of taps for a set number of bits.

BACKGROUND

DACs and analog-to-digital converters (ADCs) have come recently into more widespread use. This is due in part to improvements in process and implementation technologies as well as an increase in applications for such converters. Applications include use in multimedia, audio, video and computer peripheral products, for examples.

One common type of DAC is the so-called "string DAC". A typical N-bit string DAC, used for converting an N-bit digital word to an analog voltage, includes $2^N$ taps to a resistor ladder. The resistor ladder includes $2^N$ resistors connected in series between positive and negative supply voltages. The taps to the resistor ladder are connected through switches to an output of the DAC. Each adjacent set of taps is separated by a different one of the resistors within the ladder.

During operation, the N-bit digital word controls the switches such that one and only one of the switches closes connecting one of the taps to the DAC output. The voltage appearing at that tap is provided as an output of the DAC. As will be understood, the resistor ladder acts as a large voltage divider with each tap of the ladder being at a different voltage value. The tap selected for connection to the output depends on the digital word input to the DAC. Typically, the digital input word is decoded for controlling the switches to close one. Often, as the digital input word increases, so does the analog output voltage.

String DACs are fairly simple to implement and are inherently monotonic. String DACs are used commonly for particular applications. For example, string DACs often are used to provide reference voltage output taps in flash ADCs. Similarly, string DACs are used in applications where rail-to-rail outputs are required and a load need not be driven.

One drawback associated with string DACs is their size requirement. Typically, for an N-bit string DAC, $2^N$ taps (and resistors) are required. For a significant number of bits, i.e., bits and greater, the size can become a significant factor, particularly where large resistors are required for realizing small resistances.

SUMMARY OF THE INVENTION

Applicants have discovered a circuit and method which enables an N-bit DAC to be realized with a number of taps less than $2^N$ taps. In one embodiment, an N-bit DAC can be realized with $2^{N/2}$ taps.

One embodiment of the invention is directed to an N-bit DAC that converts an N-bit digital word to an analog voltage. The N-bit DAC includes a N-bit modified string DAC, including no more than $2^n$ taps, that receives as an input, n most significant bits (MSBs) of the N-bit digital word. The N-bit DAC also includes an m-bit interpolating DAC, coupled to the n-bit modified string DAC, that receives as an input, m least significant bits (LSBs) of the N-bit digital word, and provides an analog output to the N-bit modified string DAC.

In an embodiment, n+m=N.

In an embodiment, n=m=N/2.

In an embodiment, n=5, m=5 and N=10.

In an embodiment, the interpolating DAC includes a plurality of current DACs, wherein each current DAC provides current to or from the N-bit modified string DAC.

In an embodiment, the plurality of current DACs includes first and second current DACs.

In an embodiment, the level of current produced by each current DAC depends on the m LSBs.

In an embodiment, the sum of the currents produced by the first and second current DACs is approximately equal to the current that flows in the n-bit modified string DAC.

In an embodiment, for certain values of the MSBs of the N-bit digital word, the current provided to or from the modified string DAC by each current DAC is redirected through certain resistors of the modified string DAC.

In an embodiment, the certain values of the MSBs include zero and full-scale and the certain resistors include end resistors connected to the plurality of resistors in the modified string DAC.

Another embodiment of the invention is directed to a method for converting an N-bit digital word to an analog voltage comprising the steps of:

providing an N-bit modified string DAC, that includes no more than $2^n$ taps, the n-bit modified string DAC receiving as an input, n MSBs of the N-bit digital word, and providing the analog voltage as an output; and based on m LSBs of the digital word, increasing or decreasing a voltage level at each tap of the N-bit modified string DAC;

wherein n+m=N.

In an embodiment, the step of increasing or decreasing includes the step of using an m-bit interpolating DAC to increase or decrease a voltage level at each tap of the n-bit modified string DAC.

In an embodiment, the step of using an interpolating DAC includes using a plurality of current DACs, each current DAC providing current to or from the n-bit modified string DAC.

In an embodiment, the level of current output by each current DAC depends on the m LSBs of the N-bit digital word.

DETAILED DESCRIPTION

Figure 1:
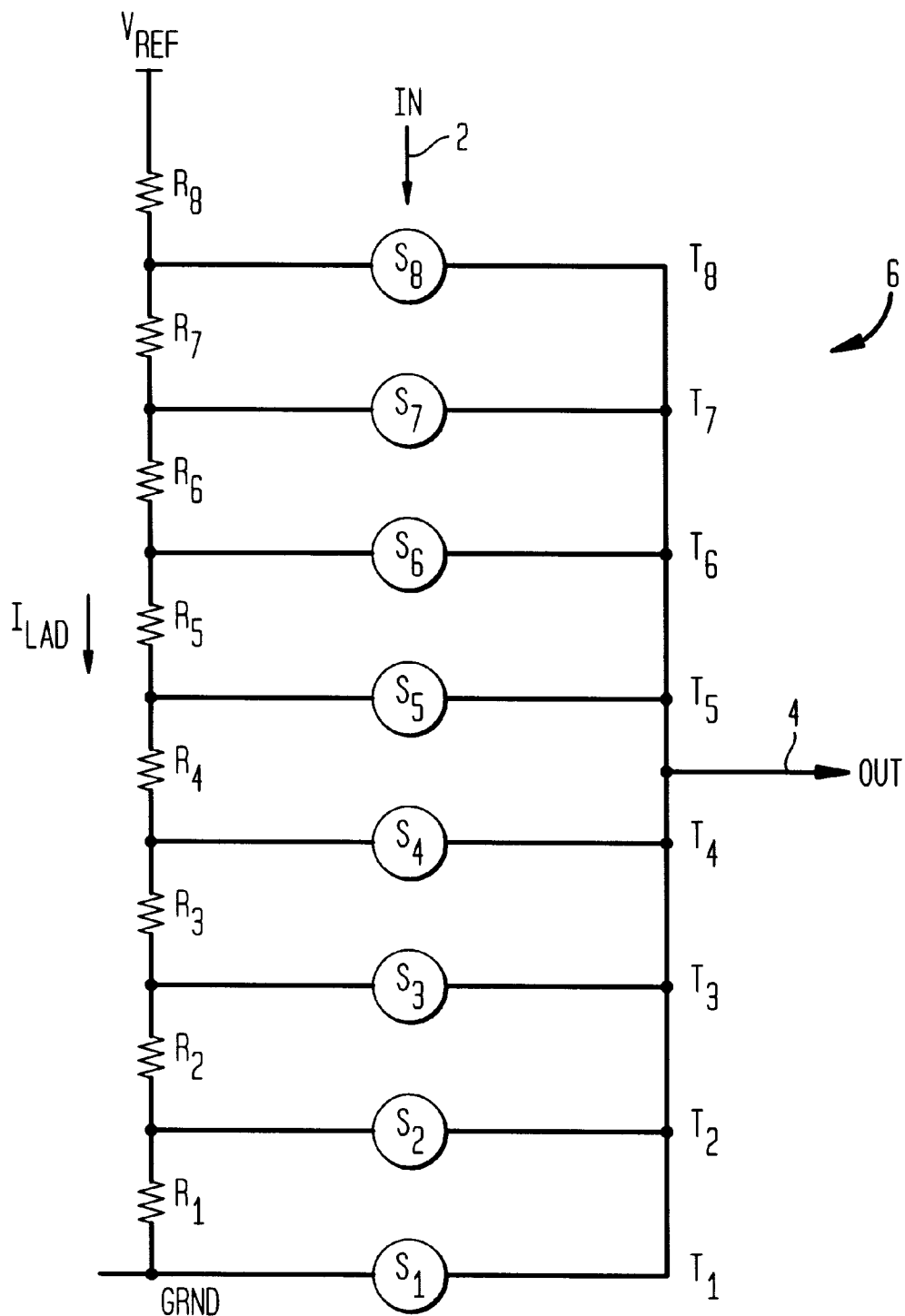
FIG. 1 is a block diagram of a conventional three-bit string DAC.

An example of a conventional three-bit string DAC is shown in FIG. 1. The string DAC includes a resistor ladder comprising eight ($2^3$) resistors R1–R8 connected in series between positive supply voltage VREF and ground GRND. There also are eight ($2^3$) taps T1–T8 to the ladder, with each pair of adjacent taps being separated by a different resistor in the ladder. Each tap T1–T8 is connected through a different switch S1–S8 to an output 4 of the string DAC.

Current ILAD runs through the resistor ladder, which acts as a voltage divider. A three-bit input digital word is received on input bus 2 and is decoded to control switches S1–S8 such that only one switch is closed at a time, providing an analog output voltage through one of taps T1–T8 to output line 4. Thus, as shown, for conventional N-bit string DACs, $2^N$ resistors and $2^N$ taps are required. The DAC of the invention enables a reduced number of resistors and taps for a set number of bits.

In general, the invention is directed to an N-bit DAC including an N-bit modified string DAC and an m-bit interpolating DAC, wherein n+m=N. The N-bit modified string DAC, in one embodiment, includes $2^n-2$ taps to a resistor ladder having $2^n-1$ resistors, and is driven by n MSBs of an N-bit digital input word. The interpolating DAC is driven by m LSBs of the N-bit digital input word. In the embodiment of the invention described, n=m=N/2, but the invention need not be so limited.

In addition, in the embodiment of the invention described, the interpolating DAC includes two current DACs. Current is provided by each current DAC to/from the n-bit modified string DAC to raise or lower the voltage level at each tap within the n-bit modified string DAC. The level of current provided depends on the m LSBs. The invention need not be limited to the dual current DAC implementation of the interpolating DAC, as described.

Also, the embodiment of the invention described specifically is directed to a 10-bit DAC including a 5-bit modified string DAC connected to a 5-bit interpolating DAC, but the invention need not be so limited.

Figure 2:
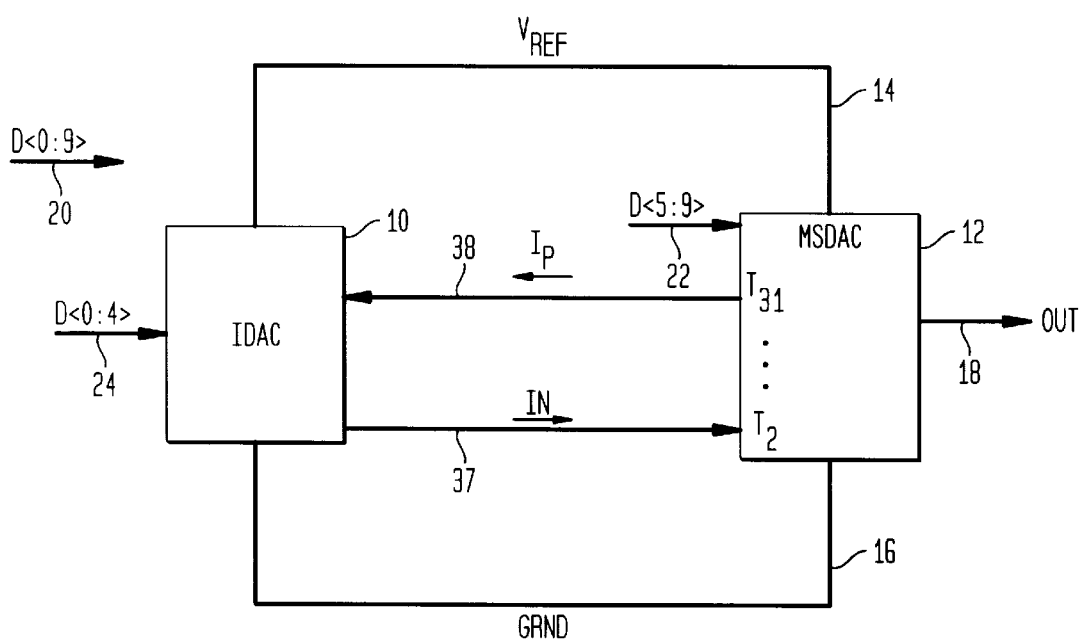
FIG. 2 is a block diagram of a DAC according to an embodiment of the invention.

FIG. 2 is a block diagram of a DAC according to one embodiment of the present invention. As shown, a 10-bit DAC includes a 5-bit interpolating DAC (labeled IDAC) and a 5-bit modified string DAC (labeled MSDAC) 12. The 10-bit DAC converts a 10-bit digital input word, received on input bus 20 and labeled D<0:9>, to an analog voltage, provided on output line 18. Interpolating DAC 10 receives as an input on bus 24, the five LSBs D<0:4> of digital input word D<0:9>. Modified string DAC 12 receives as an input on bus 22, the five MSBs D<5:9>of digital input word D<0:9>. Each of interpolating DAC 10 and modified string DAC 12 receives a positive supply voltage, labeled VREF, on rail 14, and a negative supply voltage, or ground in this exemplary embodiment, labeled GRND, on rail 16. Negative supply voltage need not be ground.

Figure 3:
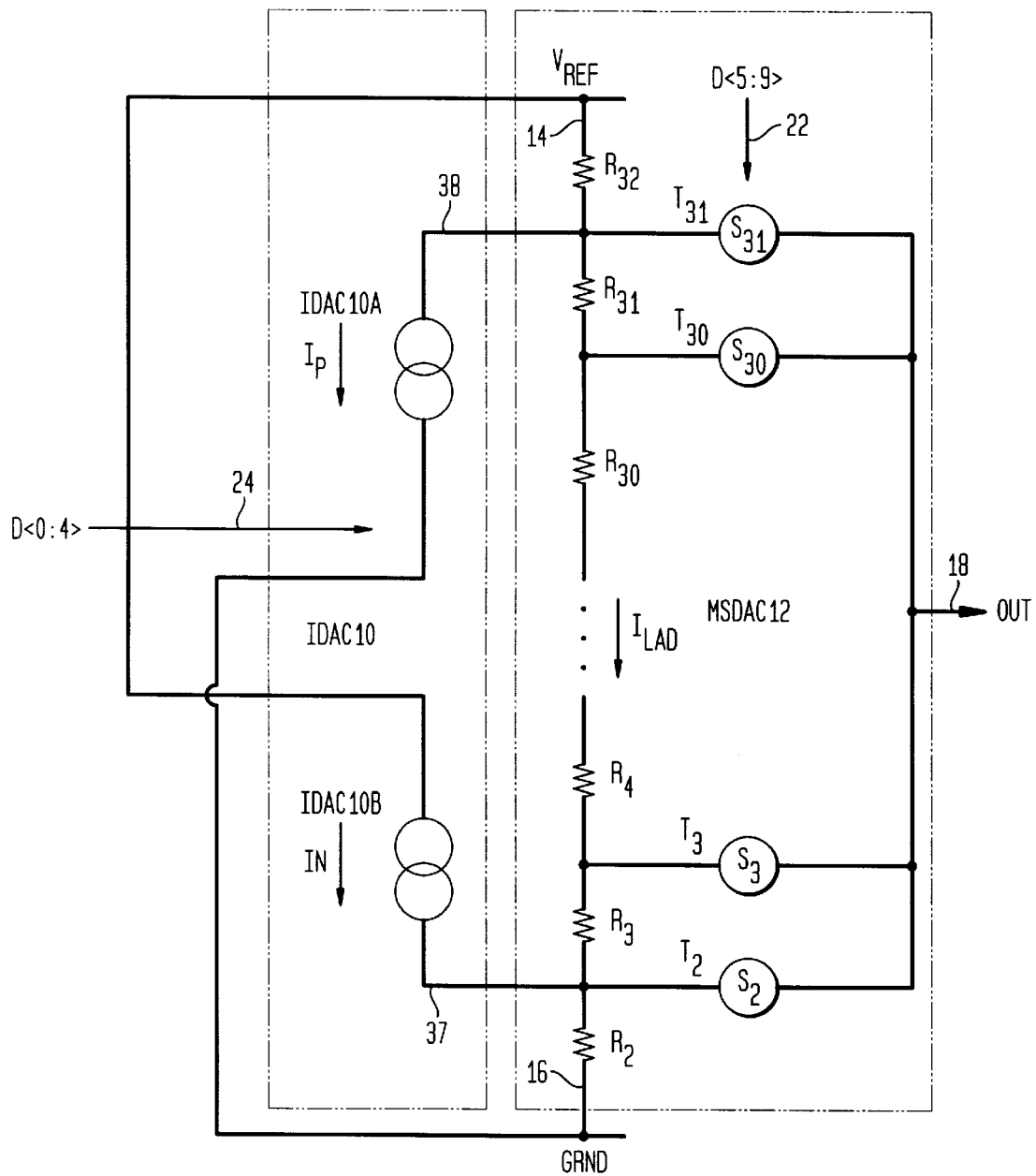
FIG. 3 is a part schematic, part block diagram of the DAC of FIG. 2.

FIG. 3 is a part schematic, part block diagram of the DAC of FIG. 2. As shown, modified string DAC 12 includes 30 taps T2–T31, as compared with 32 taps in a conventional 5-bit string DAC, one of which will be selected for providing the DAC output voltage. The one selected depends on the value of the five MSBs D<5:9>. The modified string DAC 12 may be implemented including a resistor ladder having 31 resistors R2–R32, as compared with 32 resistors in a conventional 5-bit string DAC, connected in series between positive supply rail 14 and negative supply rail 16. Current ILAD flows through the resistors in the resistor ladder. Each pair of adjacent taps is separated by a different one of the resistors within the resistor ladder. Each tap T2–T31 is connected through a different one of 30 switches S2–S31 to DAC output 18. The MSBs are decoded to control the switches, such that only one of the switches is closed at a time.

Simultaneous to the decoding of the MSBs for selection of one of the taps in the string DAC 12, interpolating DAC 10 decodes the 5 LSBs D<0:4> and resultingly increases the voltage level at each of the taps (from where it would be with the LSBs equal to zero) by an amount equal to one MSB voltage value times the value of the LSBs divided by the value of the LSBs at full-scale. Thus, the interpolating DAC interpolates between taps within the string DAC 12.

In one embodiment, as will be described, interpolating DAC 10 is implemented with two current DACs, IDAC 10A and IDAC 10B. Current DAC IDAC10A receives current IPfrom tap T31 of the resistor ladder and current DAC IDAC10B provides current IN to tap T2 of the resistor ladder such that the voltage level at each tap within string DAC 12 is increased as described above. The level of current provided to/from the taps of the resistor ladder within string DAC 12 depends on the level of the five LSBs input to the interpolating DAC. The following equation always will be met: IP+IN=ILAD.

It should be appreciated that due to the injected current provided by the interpolating DAC, the current flowing through and the voltage appearing across, each middle resistor R3–R31 of the resistor ladder, are respectively the same as the current flowing through and voltage appearing across, any resistor of a corresponding conventional resistor ladder having 32 resistors of same value connected between supplies of same value in a conventional 5-bit string DAC.

With the DAC of the embodiment shown in FIGS. 2 and 3, one MSB of range is lost at the top and bottom, i.e., full-scale and zero. The lost range is captured in a DAC according to an alternate embodiment of the invention, shown in FIGS. 4 and 5, where like reference characters are used to refer to similar elements.

Figure 4:
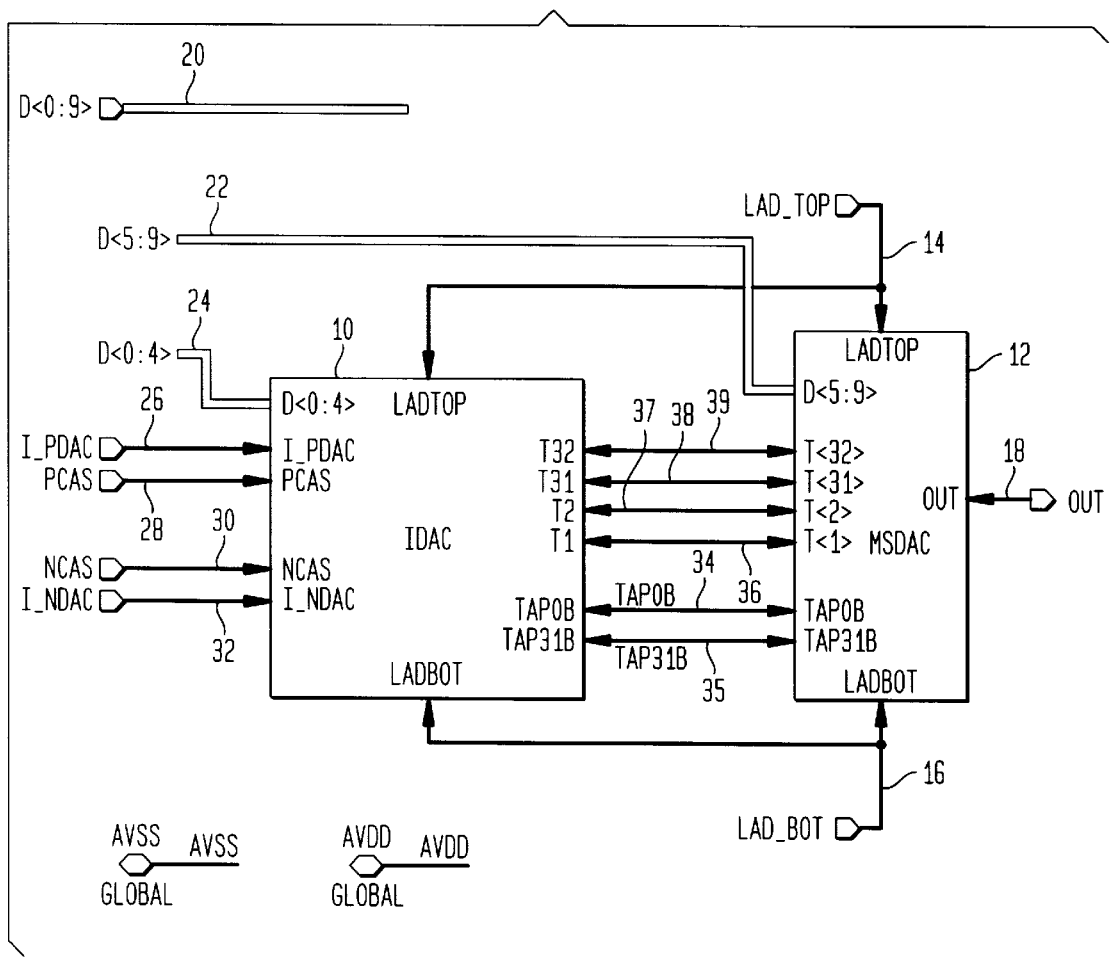
FIG. 4 is a block diagram of a DAC according to an alternate embodiment of the invention.

Referring to FIG. 4, as in the embodiment of FIGS. 2 and 3, a 10-bit DAC includes a 5-bit interpolating DAC (labeled IDAC) 10 and a 5-bit modified string DAC (labeled MSDAC) 12. In this alternate embodiment, two additional resistors R1 and R33 and two additional taps T1 and T32 are added to the modified string DAC 12, as shown in more detail in FIG. 5.

Like the DAC of FIGS. 2 and 3, interpolating DAC 10 of FIG. 4 receives as an input on bus 24, the five LSBs D<0:4> of digital input word D<0:9>. Modified string DAC 12 receives as an input on bus 22, the five MSBs D<5:9> of digital input word D<0:9>. Modified string DAC 12 receives a positive supply voltage, labeled LAD-TOP, on rail 14, and a negative supply voltage, labeled LAD-BOT, on rail 16. LAD-TOP and LAD-BOT thus define full scale and zero of the DAC output. In this embodiment, the interpolating DAC 10 also receives LAD-TOP and LAD-BOT as convenient bias voltages, but the invention need not be so limited.

As stated, in one embodiment, interpolating DAC 10 includes first and second current DACs. The first current DAC receives an input current I_PDAC on line 26 and divides this current depending on the level of the five LSBs D<0:4>. The current output by this first current DAC is drawn from one of taps T31 and T32 of modified string DAC 12 depending on the level of the MSBs D<5:9>, as will be described in more detail below. The second current DAC receives an input current I_NDAC on line 32 and divides this input current depending on the level of the LSBs D<0:4>. The current output by this second current DAC is provided to one of taps T1 and T2 of modified string DAC 12, also depending on the level of the MSBs D<5:9>, as will be described.

Digital logic (not shown) within string DAC 12 decodes the five MSBs to determine whether current from the first current DAC is provided from tap T31 or tap T32 and whether current from the second current DAC is provided to tap T1 or tap T2. Control signal TAP31B is provided along line 35 from modified string DAC 12 to interpolating DAC 10 to control whether current from the first current DAC is provided from tap T31 or from tap T32, as will be described. Similarly, control signal TAP0B is provided from modified string DAC 12 along line 34 to interpolating DAC 10 to control whether current from the second current DAC is provided to tap T1 or tap T2, as will be described. Interpolating DAC 10 also receives cascode transistor bias voltages PCAS and NCAS along lines 28 and 30, respectively.

The input currents I_PDAC and I_NDAC, provided respectively to the first and second current DACs within interpolating DAC 10, as well as the cascode transistor bias voltages PCAS and NCAS, are produced by a bias generator (not shown). In an embodiment, the bias generator replicates the resistor ladder of the modified string DAC 12 and measures the full-scale current within the ladder. The bias generator then generates the input currents I_PDAC and I_NDAC such that the sum of the two currents is equal to the full-scale current in the replicated string DAC ladder. In one embodiment, the bias generator would receive positive supply LAD-TOP and negative supply LAD-BOT and place these received supply voltages across the replicated ladder for the purpose of achieving the same current value.

Figure 5:
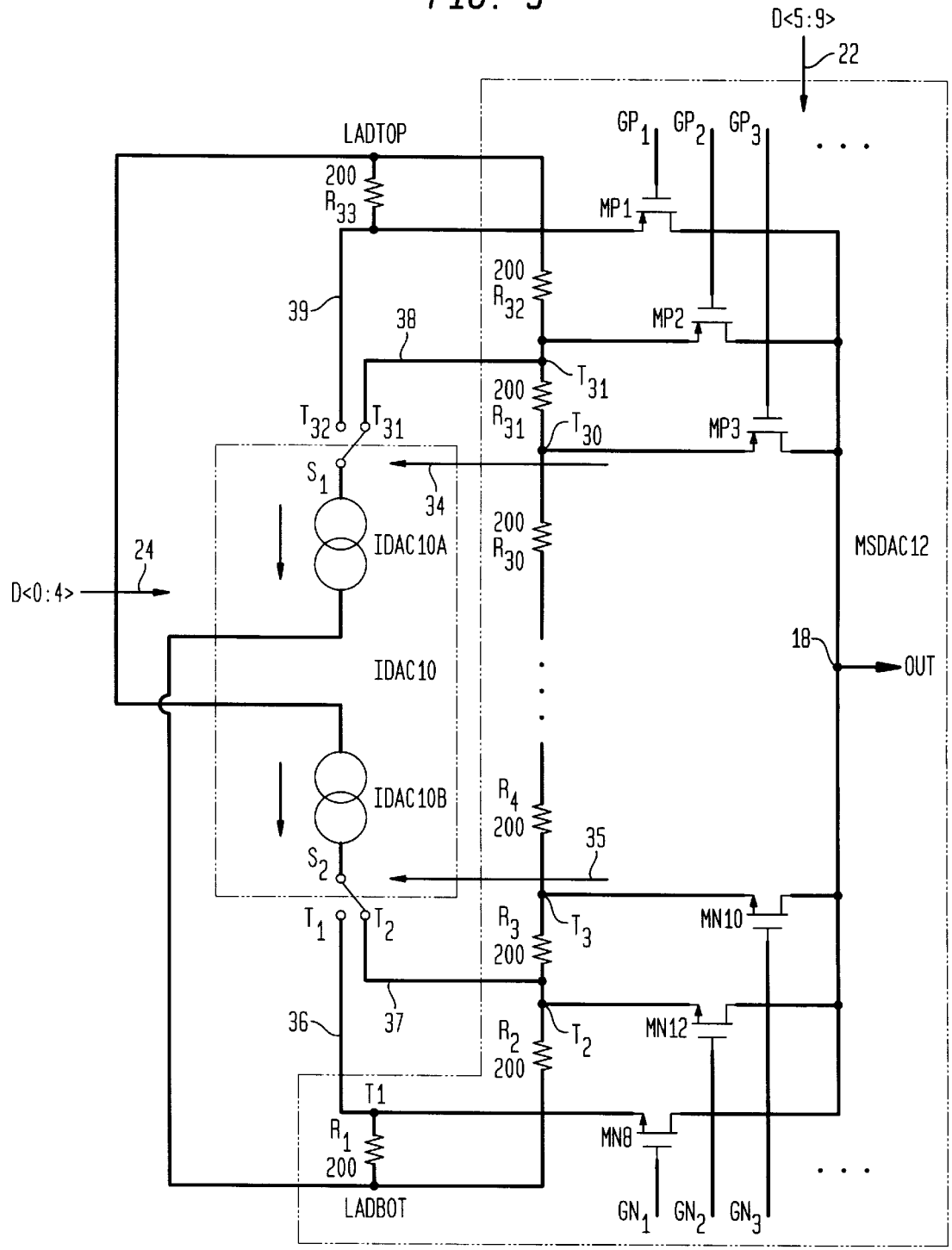
FIG. 5 is a part schematic, part block diagram of the DAC of FIG. 4.

FIG. 5 is a part block, part schematic diagram of the 10-bit DAC of the embodiment of FIG. 4. Shown are the 5-bit interpolating DAC 10 and 5-bit modified string DAC 12. Interpolating DAC 10 includes a first current DAC IDAC 10A and a second current DAC IDAC 10B. String DAC 12 includes resistors R1–R33 (only eight of the resistors are shown) and taps T1–T32 (only taps T1, T2, T3, T30, T31 and T32 are shown). Resistors R2–R32 are connected between positive supply LAD_TOP and negative supply LAD_BOT. In addition, resistor R1 is connected between negative supply LAD_BOT and tap T1 and a resistor R33 is connected between positive supply LAD_TOP and tap T32. The remaining taps are connected between a different pair of adjacent resistors. Tap T2 is connected between resistors R2 and R3. Tap T3 is connected between resistors R3 and R4, and so on.

Each tap is connected through a different switch (only six switches are shown) to output 18. For the top half of the resistor ladder, the tap switches consist of P-channel metal oxide semiconductor field effect transistors (MOSFETs). Switch MP1 connects tap T32 to output 18. Switch MP2 connects tap T31 to output 18, and so on. For the lower half of the resistor ladder, the tap switches consist of N-channel MOSFETs. Switch MN8 connects tap T1 to output 18. Switch MN12 connects tap T2 to output 18, and so on. The invention need not be so limited.

The five MSBs D<5:9> are shown as an input on line 22 to string DAC 12. As will be understood, the five MSBs may be decoded before being provided to the gates of the switches of the respective taps such that only one tap switch, for a given input word, is selected for providing an output voltage to output 18.

In the embodiment shown, current DAC IDAC 10A provides current from one of taps T31 and T32 and current DAC IDAC 10B provides current to one of taps T1 and T2. The sum of the currents provided by current DACs IDAC 10A and IDAC 10B remains constant and is approximately equal to the full scale current in the current ladder in modified string DAC 12. The level of current produced by each current DAC IDAC 10A and IDAC 10B depends on the four LSBs D<0:4> received on line 24. Thus, when the four LSBs are decoded, the level of current provided by each current DAC IDAC 10A and IDAC 10B is determined.

When the current provided by current DAC IDAC 10A increases by a certain amount, the current provided by current DAC IDAC 10B decreases by that same amount. Thus, for a given input digital word (i.e., all except zero and full-scale values of the MSBs), when the end taps T1 and T32 are not selected, by removing current from one tap (T31 or T32) and providing current to another tap (T1 or T2), wherein the sum of the currents remains constant, the voltage level at each tap but for the end taps T1 and T32 is increased (from where it would be with the LSBs equal to zero) by a fraction of one MSB voltage value proportional to the LSBs, as described above.

The position of switch S1, which controls whether current DAC IDAC 10A provides current from tap T31 or from tap T32, is controlled by control signal TAP0B, received on line 34 from string DAC 12. Switch S1 remains connected to tap T31, such that current IDAC 10A provides current from tap T31, for all values except for the full-scale value of the five MSBs. When the five MSBs are equal to full-scale, control signal TAP0B causes switch S1 to switch to tap T32 such that current DAC IDAC 10A provides current from tap T32.

The position of switch S2, which controls whether current DAC IDAC 10B provides current to tap T1 or to tap T2, is controlled by control signal TAP31, received on line 35 from string DAC 12. Switch S2 remains connected to tap T2, such that current from current DAC IDAC 10B is provided to tap T2, for all values of the five MSBs except for zero. When the five MSBs are equal to zero, control signal TAP 31B, causes switch S2 to switch to tap T1 such that current DAC IDAC 10B provides current to tap T1.

Figure 6A:
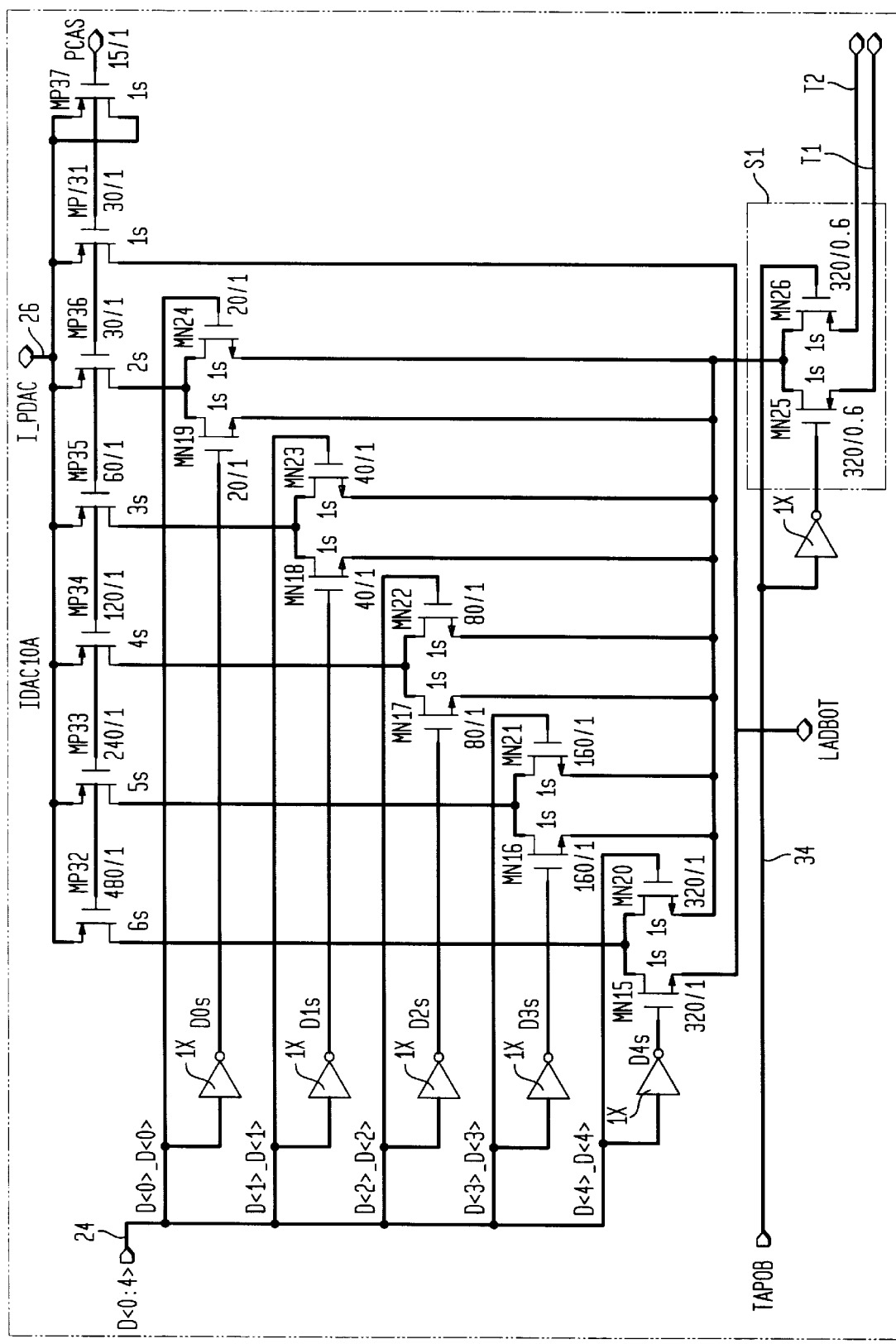
FIG. 6 is a schematic diagram of an exemplary interpolating DAC according to an embodiment of the invention.
Figure 6B:
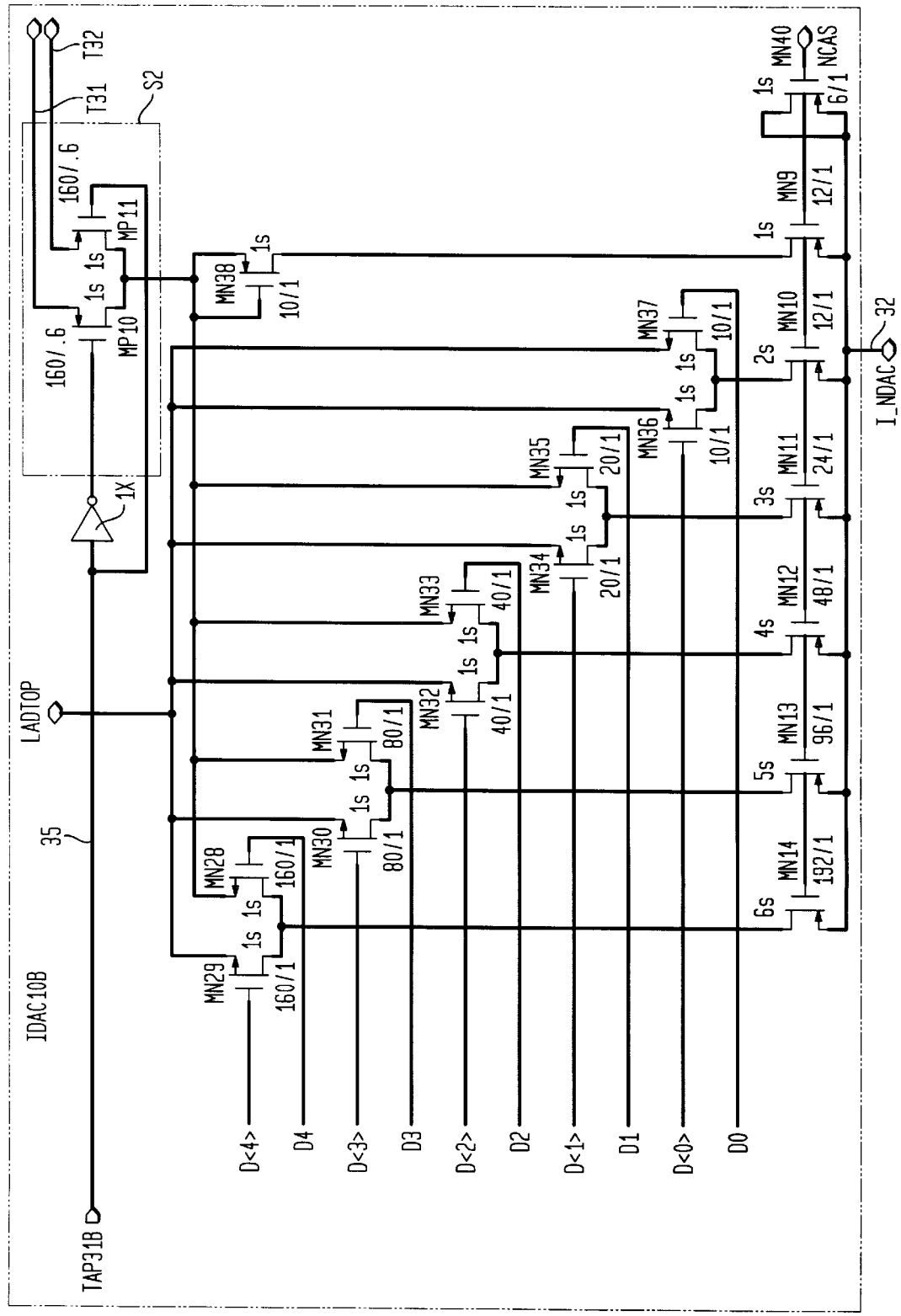

FIG. 6 is a schematic diagram of an exemplary implementation of interpolating DAC 10. As shown, interpolating DAC 10 includes current DAC IDAC 10A and current DAC IDAC 10B. Current DAC IDAC 10A includes a number of switches, implemented as transistor pairs. Current DAC IDAC 10A receives the LSBs on line 24 and computes the inverse of each LSB. Each LSB and its inverse control a different switch such that input current I_PDAC, received on line 26, is divided (depending on the level of the LSBs) and provided through switch S1 to one of taps T1 and T2. In this exemplary embodiment, switch S1 consists of n-channel MOSFETs MN25 and MN26. Switch S1 is controlled by control signal TAP0B, received on line 34, and its inverse.

Current DAC IDAC 10B also includes a number of switches, implemented as transistor pairs. Each switch is controlled by a different LSB and its inverse. The input current I_NDAC, received on line 32, is divided depending on the level of the LSBs. The divided current is provided through switch S2 to one of taps T31 or T32. In this exemplary embodiment, switch S2 consists of two P-channel MOSFETs MP10 and MP11. Switch S2 is controlled by control signal TAP31B, received on line 35, and its inverse.

Interpolating DAC 10 may be thought of as acting as sliding scale for interpolating between appropriate taps within modified string DAC 12. The present invention enables a 10-bit DAC to be implemented using a modified string DAC with no more than 32 taps. This provides significant savings in size.

Having thus described at least one illustrative embodiment of the invention, various alterations, modifications and improvements will readily occur to those skilled in the art. Such alterations, modifications and improvements are intended to be within the spirit and scope of the invention.

Accordingly, the foregoing description is by way of example only and is not intended as limiting. The invention is limited only as defined in the following claims and the equivalents thereto.

What is claimed is:

1. An N-bit DAC that converts an N-bit digital word to an analog voltage comprising:

an N-bit modified string DAC, including a plurality of resistors connected in series between first and second reference voltages and no more than $2^n$ taps, receiving as an input, n MSBs of the N-bit digital word, and providing the analog voltage as an output; and an m-bit interpolating DAC, coupled to the N-bit modified string DAC, that receives as an input, m LSBs of the N-bit digital word, and provides an analog output to the modified string DAC;

wherein n+m=N.

2. The N-bit DAC as claimed in claim 1 wherein n=m=N/2.

3. The N-bit DAC as claimed in claim 1 wherein the interpolating DAC includes a plurality of current DACs, each current DAC providing current to or from the modified string DAC.

4. The N-bit DAC as claimed in claim 3 wherein the plurality of current DACs includes first and second current DACs.

5. The N-bit DAC as claimed in claim 4 wherein a level of current produced by each current DAC depends on the m LSBs, and wherein the sum of currents produced by both current DACs is approximately equal to current in the modified string DAC.

6. The N-bit DAC as claimed in claim 2 wherein N=10, m=5 and n=5.

7. The N-bit DAC as claimed in claim 3 wherein for certain values of the MSBs of the N-bit digital word, the current provided to or from the modified string DAC by each current DAC is redirected through certain resistors of the modified string DAC.

8. The N-bit DAC as claimed in claim 7 wherein the certain values of the MSBs include zero and full-scale and the certain resistors include end resistors connected to the plurality of resistors in the modified string DAC.

9. A method for converting an N-bit digital word to an analog voltage comprising the steps of:

providing a modified string DAC, including a plurality of resistors connected in series between first and second reference voltages and no more than $2^n$ taps, the modified string DAC receives as an input, n MSBs of the N-bit digital word; and based on m LSBs of the N-bit digital word, increasing or decreasing a voltage level at each tap of the modified string DAC to provide the analog output;

wherein n+m=N.

10. The method as claimed in claim 9 wherein the step of increasing or decreasing includes the step of using an m-bit interpolating DAC to increase or decrease the voltage level at each tap of the modified string DAC.

11. The method as claimed in claim 10 wherein the step of using an m-bit interpolating DAC includes the step of using a plurality of current DACs, each current DAC providing current to or from the N-bit modified string DAC.

12. The method as claimed in claim 11 wherein current provided from each current DAC depends on the m LSBs.

* * * * *